United States Patent
Eggleston

(10) Patent No.: US 9,436,609 B2
(45) Date of Patent: Sep. 6, 2016

(54) BLOCK ADDRESSING FOR PARALLEL MEMORY ARRAYS

(71) Applicant: MICRON TECHNOLOGY, INC., Boise, ID (US)

(72) Inventor: David Eggleston, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 14/616,468

(22) Filed: Feb. 6, 2015

(65) Prior Publication Data

US 2015/0220441 A1    Aug. 6, 2015

Related U.S. Application Data

(63) Continuation of application No. 11/773,321, filed on Jul. 3, 2007, now abandoned.

(51) Int. Cl.
| | |
|---|---|
| *G06F 12/02* | (2006.01) |
| *G06F 3/06* | (2006.01) |
| *G06F 12/08* | (2016.01) |
| *G11C 8/12* | (2006.01) |
| *G11C 29/00* | (2006.01) |
| *G06F 12/10* | (2016.01) |

(52) U.S. Cl.
CPC ........... *G06F 12/0853* (2013.01); *G06F 3/064* (2013.01); *G06F 3/0611* (2013.01); *G06F 3/0619* (2013.01); *G06F 3/0656* (2013.01); *G06F 3/0688* (2013.01); *G06F 12/0246* (2013.01); *G06F 12/0292* (2013.01); *G06F 12/1072* (2013.01); *G11C 8/12* (2013.01); *G11C 29/76* (2013.01); *G06F 2003/0691* (2013.01); *G06F 2212/1024* (2013.01); *G06F 2212/2022* (2013.01); *G06F 2212/283* (2013.01); *G06F 2212/7201* (2013.01); *G06F 2212/7208* (2013.01)

(58) Field of Classification Search
CPC ...... G06F 3/061; G06F 3/064; G06F 3/0688; G06F 12/0246; G06F 12/0292; G06F 12/10
See application file for complete search history.

(56) References Cited

U.S. PATENT DOCUMENTS

| | | |
|---|---|---|
| 4,628,451 A | 12/1986 | Sawada et al. |
| 4,959,812 A | 9/1990 | Momodomi et al. |
| 5,815,456 A | 9/1998 | Rao |

(Continued)

OTHER PUBLICATIONS

Korean Patent Office; Notice of Allowance dated Sep. 3, 2015, from related application Korean Patent Application No. 10-2010-7002399 (filed Jun. 30, 2008).

(Continued)

*Primary Examiner* — Hal Schnee
(74) *Attorney, Agent, or Firm* — Brooks, Cameron & Huebsch, PLLC

(57) ABSTRACT

Apparatus and methods provide associative mapping of the blocks of two or more memory arrays such that data, such as pages of data, from the good blocks of the two or more memory arrays can be read in an alternating manner for speed or can be read in parallel for providing data to relatively wide data channels. This obviates the need for processor intervention to access data and can increase the throughput of data by providing, where configured, the ability to alternate reading of data from two or more arrays. For example, while one array is loading data to a cache, the memory device can be providing data that has already been loaded to the cache.

20 Claims, 12 Drawing Sheets

(56) References Cited

U.S. PATENT DOCUMENTS

| | | |
|---|---|---|
| 5,835,928 A | 11/1998 | Auslander et al. |
| 5,923,605 A | 7/1999 | Mueller et al. |
| 6,125,421 A | 9/2000 | Roy |
| 6,233,196 B1 | 5/2001 | Lee |
| 6,611,894 B1 | 8/2003 | Onoo |
| 6,906,961 B2 | 6/2005 | Eggleston et al. |
| 6,914,814 B2 | 7/2005 | Im et al. |
| 6,950,352 B1 | 9/2005 | Jung et al. |
| 7,123,512 B2 | 10/2006 | Lakhani et al. |
| 7,154,780 B2 | 12/2006 | Lakhani et al. |
| 7,154,781 B2 | 12/2006 | Lakhani et al. |
| 7,154,782 B2 | 12/2006 | Lakhani et al. |
| 7,219,200 B2 | 5/2007 | Takasugi |
| 7,680,988 B1 | 3/2010 | Nickolls et al. |
| 2004/0246806 A1 | 12/2004 | Ha |
| 2005/0144516 A1 | 6/2005 | Gonzalez et al. |
| 2005/0162947 A1* | 7/2005 | Kim et al. ............ G11C 29/76 365/200 |
| 2005/0268208 A1 | 12/2005 | Shimizume et al. |
| 2005/0283657 A1 | 12/2005 | Nishihara |
| 2006/0028851 A1 | 2/2006 | Pawlowski |
| 2006/0083096 A1 | 4/2006 | Yang |
| 2006/0227646 A1 | 10/2006 | Kasamsetty et al. |
| 2006/0282610 A1 | 12/2006 | Dariel et al. |
| 2007/0043900 A1 | 2/2007 | Yun |
| 2007/0086243 A1 | 4/2007 | Jo |
| 2007/0136509 A1 | 6/2007 | Agami |
| 2007/0153619 A1 | 7/2007 | Choo et al. |
| 2007/0245070 A1 | 10/2007 | Mitsunaga |
| 2008/0209107 A1* | 8/2008 | Murray ............... G06F 12/0246 711/103 |

OTHER PUBLICATIONS

International Searching Authority; "Notification of Transmittal of the International Search Report and the Written Opinion of the International Searching Authority, or the Declaration", "Written Opinion of the International Searching Authority", and the "International Search Report" of Related PCT Application, Application No. PCT/US2008/068849, filed Jun. 30, 2008; Oct. 30, 2008; Korean Intellectual Property Office; Daejeon, Republic of Korea.

The International Bureau of WIPO; International Preliminary Report on Patentability of related PCT Application No. PCT/US2008/068849, filed Jun. 30, 2008; mailing date Jan. 14, 2010; Geneva, Switzerland.

Korean Patent Office; Office Action dated Sep. 22, 2014, from related application Korean Patent Application No. 10-2010-4002399 (filed Jun. 30, 2008).

Korean Patent Office; Office Action dated Mar. 6, 2015, from related application Korean Patent Application No. 10-2010-4002399 (filed Jun. 30, 2008).

\* cited by examiner

US 9,436,609 B2

1

BLOCK ADDRESSING FOR PARALLEL MEMORY ARRAYS

CROSS-REFERENCE TO RELATED APPLICATION

This application is a continuation application of U.S. application Ser. No. 11/773,321, filed Jul. 3, 2007, now abandoned, the entirety of which is incorporated by reference herein.

BACKGROUND

1. Field of the Invention

Embodiments of the invention generally relate to integrated circuits. In particular, embodiments of the invention relate to memory circuits.

2. Description of the Related Art

Semiconductor memory devices are ubiquitous in digital electronics devices. Examples of these devices include computers, cameras, digital media players, games, personal digital assistants, mobile phones, navigation devices, non-volatile storage products, and the like. Examples of non-volatile storage products include CompactFlash (CF) cards, MultiMedia cards (MMC), secure digital (SD) cards, Flash PC cards (e.g., ATA Flash cards), SmartMedia cards, solid-state disks (SSDs), hybrid hard drives, and memory sticks. Semiconductor memory provides storage and retrieval of data.

There exist many types of semiconductor memories. Examples of memories include various types of random access memory (RAM) (including SRAM, DRAM, and SDRAM), flash memory, electrically erasable programmable read only memory (EEPROM), magnetoresistive random access memory (MRAM), programmable conductor memory, ferroelectric memory, and the like. There are also many subtypes within these memories.

Typically, the memory cells of a memory device are arranged in one or more arrays and are accessed by activation of appropriate word lines (rows) and bit lines (columns). In most types of memory devices, each cell stores a single bit of data. However, some cells, such as flash memory cells, can store data in more than one level (more than one bit per cell).

Memory devices can also be organized into pages and further into blocks. For example, NAND flash is generally organized into blocks and pages. This organization can also be found in NOR flash, electrically erasable programmable read only memory (EEPROM), and programmable read only memory (PROM). The sizes of the blocks and pages can vary in a very broad range. One example of a 2 gigabyte (GB) memory array has 2,048 blocks, each block having 64 pages, with each page having 2,112 bytes, including 2,048 data bytes and 64 spare bytes (not including spare blocks, pages, rows, columns, etc.). Conceptually, this is illustrated in FIG. 1.

Bad or unusable memory cells can be identified during test. For example, a memory cell can fail for being stuck in a particular logic state, for not meeting a timing specification, or the like. During production, these failures can be mapped and corrected by substitution of defective rows and/or columns with extra or redundant rows and/or columns in an array. This type of failure is typically handled by the permanent mapping of internal addresses for individual rows and addresses within an array and is transparent to the end user.

2

Cells can also fail in the field. For example, many non-volatile memory types can wear out over multiple write cycles. Some memory devices can also include error correction codes (ECC), and are tolerant of bad cells within correctable limits. Unless correctable by some form of error correction, bad or unusable memory cells should not be used. Bad or unusable memory cells can affect the usability of higher order memory units. For example, bad cells can cause a row to be unusable, and the page(s) of the row to be unusable. Blocks of memory can also have spare pages to replace bad pages. When an insufficient number of pages for a block is available, the entire block may be marked as a bad block, and none of the pages of that block are typically accessible.

A problem arises in the handling of bad blocks. Bad blocks can be marked in a bad block table. For example, if a block is determined to be bad during production test, a repair procedure can be used to replace the bad block with a spare block.

With reference to FIG. 2, in one example, two or more arrays store data from or provide data to a data bus. It can take longer to write to or read from a page of data to or from an array 202, 204 than to or from a cache register 206, 208. For speed, the memories can be arranged such that a page from one array 202 is written to or read first, then a page from a second array 204 is written to or read, then a new page is written to or read from the first array 202, and so forth. This is known as "ping-ponging," and is fast because the data from the alternate array can be preloaded into the applicable cache register 206, 208 while the data from the other cache is being written or read. Other registers 210, 212 can assist with the writing or the fetching of data. If the arrays 202, 204 are on the same chip, the cache registers 206, 208 can be shared, i.e., there would typically be only one cache register.

However, if the addresses are not sequential, then the preloading may not occur efficiently. For example, when two 8-bit chips are used to provide data, then address lines that are provided to the two chips are typically shared, and the least significant bit (LSB) of an address line is redundant. In a conventional chip with multiple arrays, not only are the address lines shared, but a row decoder is also typically shared among the multiple arrays. When a block of an array is bad, a repair solution can map a different block to the same logical address as a good block. However, the activation of a different set of row lines for the replacement block can considerably lengthen write or read times because, for example, two different physical memory locations are then accessed from within the memory device for writing or reading. This is shown in FIG. 3.

FIG. 3 illustrates an example of a conventional technique for pairing blocks from two different memory arrays 302, 304. More than two memory arrays can be "paired" or matched, i.e., associated for storage and retrieval together. In another example, 4 arrays or 8 arrays are "paired." In the illustrated example, the first four blocks (1A-4A) 306, 308, 310, 312 from memory array A 302 are good. A first block 1B 314, a second block 2B 316, and a fourth block 4B 320 from memory array B 304 are good. However, a third block 3B 318 of memory array B 304 is bad. The first block 1A 306 and the first block 1B 314 are paired. The second block 2A 308 and the second block 2B 316 are paired. The fourth block 4A 312 and the fourth block 4B 320 are paired.

However, the third block 3A 310 from array A 302 is not paired with the third block 3B 318 from array B 304 because the third block 3B 318 is bad and is not usable. Rather, the third block 3A 310 is paired with another block XB 322 from array B. Typically, the good blocks at the end (by physical address) of an array are spare blocks, and the other block XB 322 that is used is selected from one of the spare blocks. For example, block XB 322 can be the 2,050-th block of an array specified to have at least 2,048 good blocks. The third block 3A 310 and the other block XB 322 are at different physical addresses, and when pages of data are stored to or retrieved from each, the pages from the third block 3A 310 and the pages from the block XB 322 are internally accessed using two separate accesses and without "ping-ponging." This reduces performance. For example, the technique illustrated in FIG. 3 typically uses some form of internal controller intervention to select the replacement block(s) and to combine data from separate internal memory reads, which further slows down access.

The use of multiple arrays for data is common. In systems with multiple channels of data, there can be data from multiple arrays for a data stream. Another example where blocks can be paired is when a data bus is relatively wide, such as in a 32-bit wide data bus, and each of four memory arrays handles 8 bits of the 32 bits of data.

FIG. 4 illustrates an example of a conventional technique for pairing blocks from two different memory arrays 402, 404. In this technique, the entire physical address of a bad block is skipped, and the next physical address with two or more good blocks is used. This technique still typically uses controller intervention to manage the jump in physical addresses. In the illustrated example, the first four blocks (1A-4A) 406, 408, 410, 412 from memory array A 402 are good. A first block 1B 414, a second block 2B 416, and a fourth block 4B 420 from memory array B 404 are good. However, a third block 3B 418 of memory array B 404 is bad. The first block 1A 406 and the first block 1B 414 are paired. The second block 2A 408 and the second block 2B 416 are paired. The fourth block 4A 412 and the fourth block 4B 420 are paired.

However, the third block 3A 410 from array A 402 is not paired with the third block 3B 418 from array B 404 because the third block 3B 418 is bad and is not usable. In contrast to the example of FIG. 3, where the block 3A 310 is still used, in the example of FIG. 4, the third block 3A 410, while good, is left unpaired and unused. This preserves the ability of the arrays 402, 404 to "ping-pong" for speed when reading the various pages of associated blocks as the paired blocks arranged in this manner use the same physical addresses and are accessible with activation of the same rows of a shared row decoder. However, the third block 3A 410 is not utilized despite its viability and is effectively treated as a bad block. This decreases the number of available blocks for an array, and if the effective number of good blocks falls below the minimum specified, this can decrease the production yield and increase the cost of production.

BRIEF DESCRIPTION OF THE DRAWINGS

These drawings and the associated description herein are provided to illustrate embodiments and are not intended to be limiting.

DETAILED DESCRIPTION OF EMBODIMENTS

Although particular embodiments are described herein, other embodiments of the invention, including embodiments that do not provide all of the benefits and features set forth herein, will be apparent to those of ordinary skill in the art.

One embodiment of the invention provides associative mapping of the blocks of two or more memory arrays such that data, such as pages of data, from good blocks of the two or more memory arrays can be written or read in an alternating manner for speed or can be written to read in parallel for providing data to relatively wide data channels. For example, this obviates controller intervention to access associated data spread among disparate rows and can increase the throughput of data by providing, where configured, the ability to alternate reading of data from two or more arrays. For example, while data from one array is being loaded to a cache, data from another array that has already been loaded to the cache can be read. In one example, the mapped blocks correspond to the smallest erasable entity of a flash device. In another example, the mapped blocks correspond to a relatively large number of memory cells. In addition, relatively few of the good blocks of an array go unused.

Figure 1:
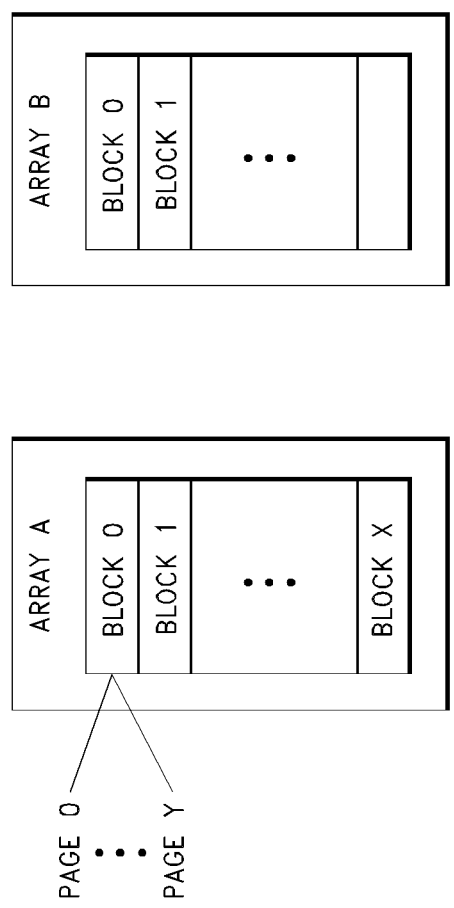
FIG. 1 illustrates a memory architecture with multiple pages and blocks within arrays.
Figure 2:
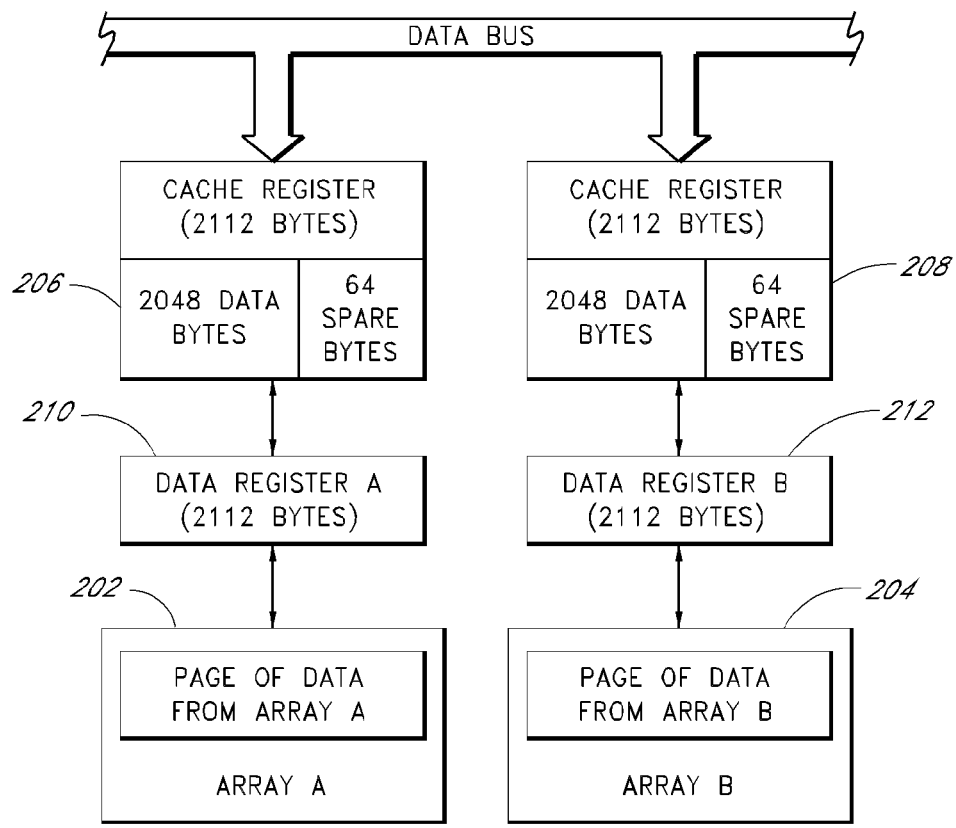
FIG. 2 illustrates reading from multiple memories for fast access or for parallel access.
Figure 3:
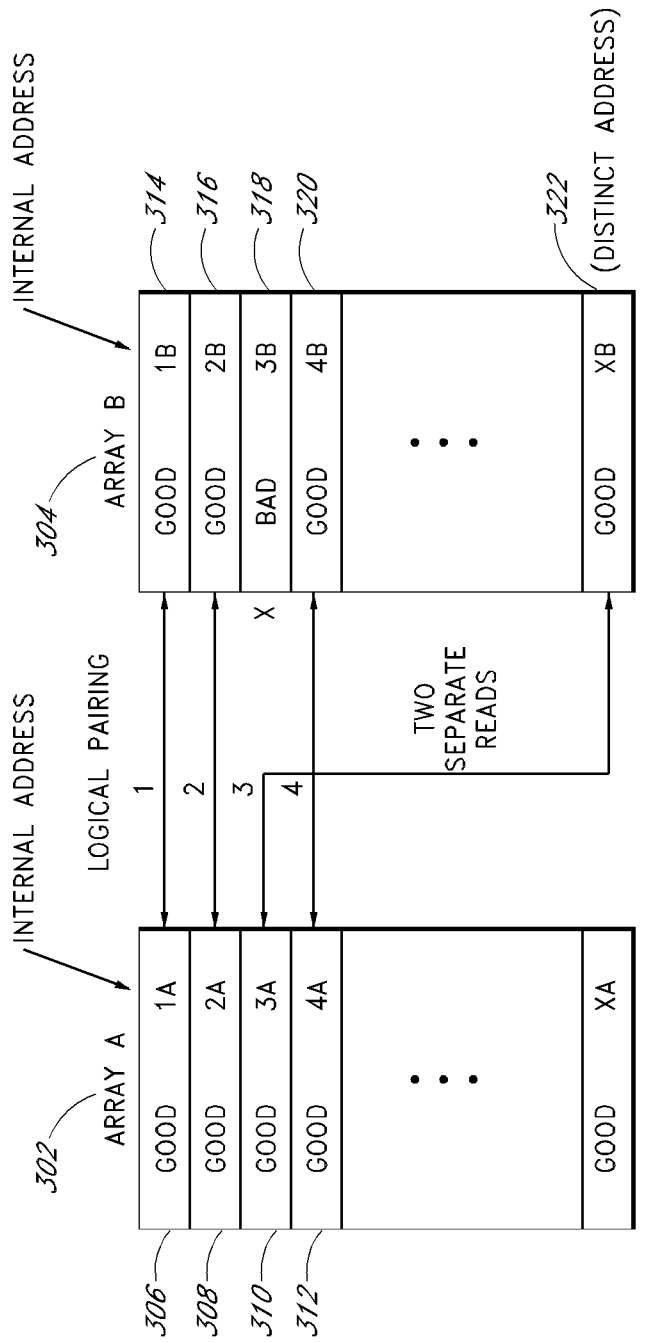
FIG. 3 illustrates a prior art technique of pairing blocks from different memory arrays, which results in relatively slow access to data.
Figure 4:
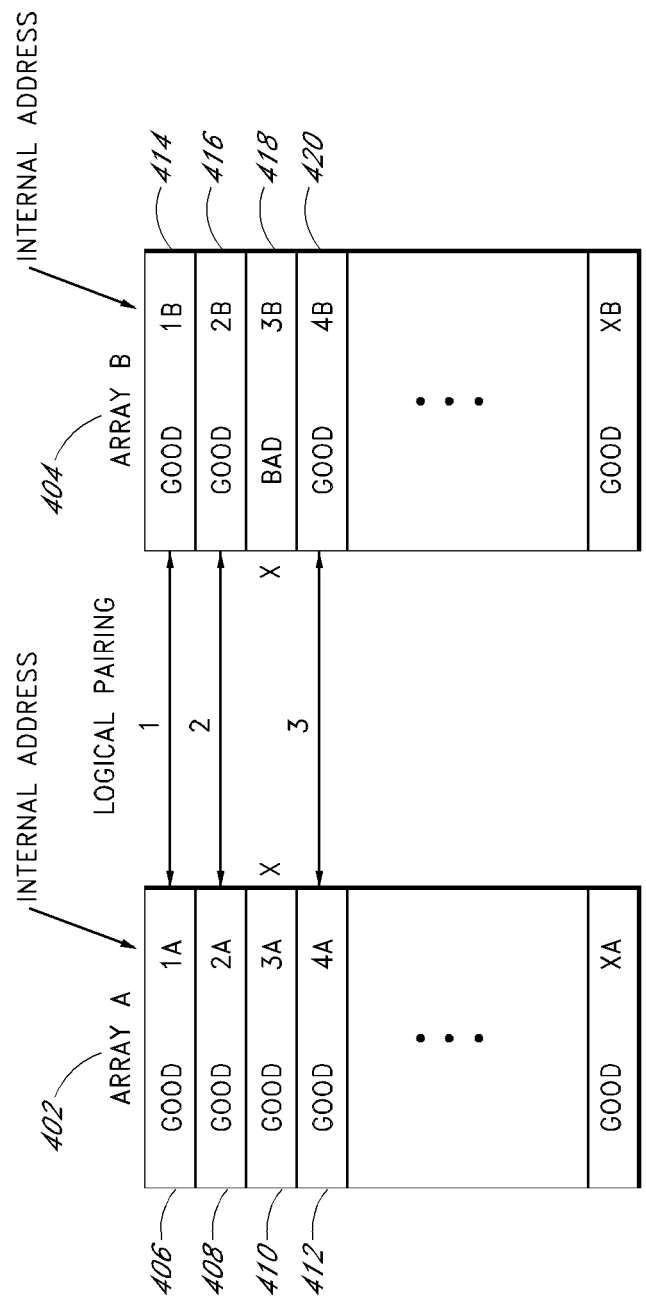
FIG. 4 illustrates a prior art technique of pairing blocks from different memory arrays, which results in inefficient utilization of memory space.
Figure 5:
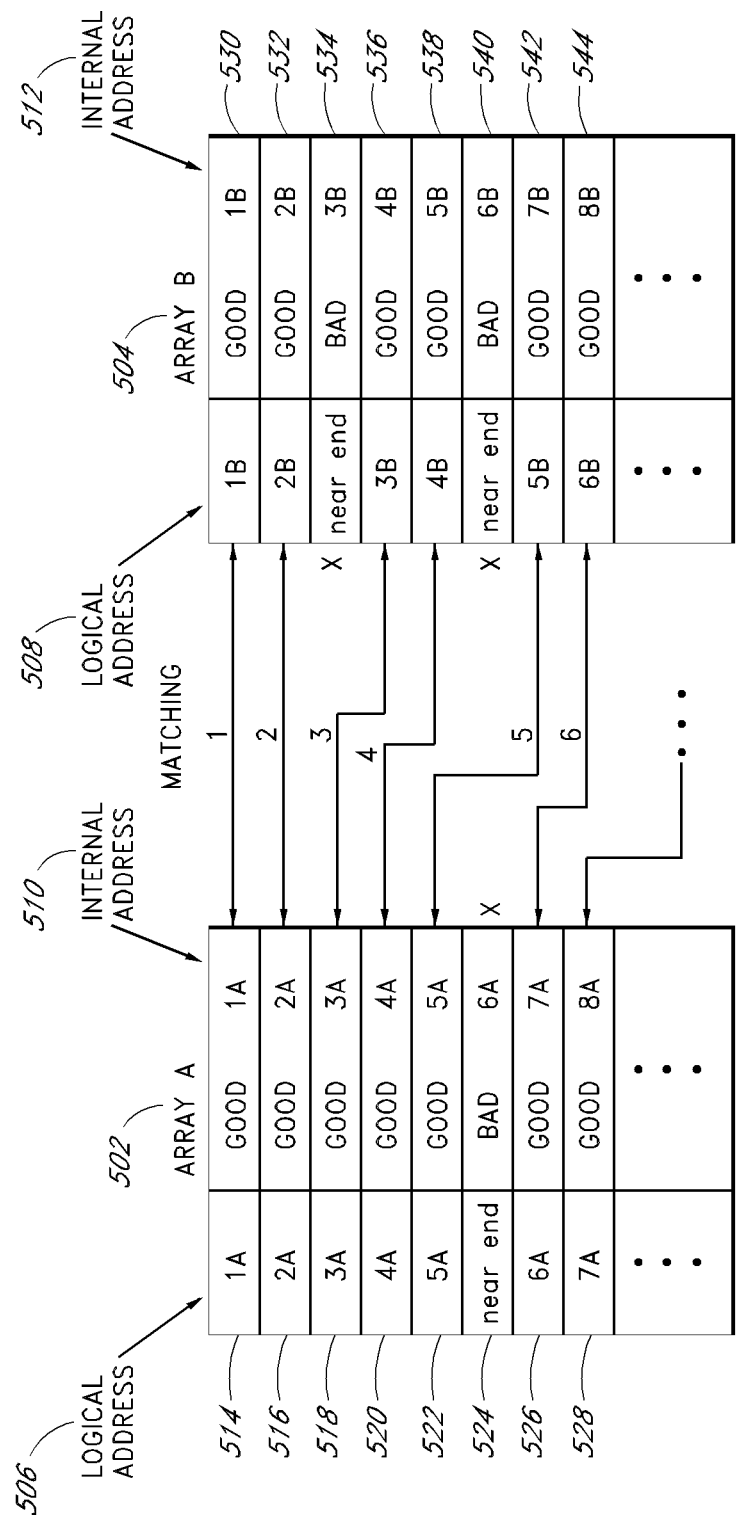
FIG. 5 illustrates an example of collectively mapping blocks for two arrays.
Figure 6:
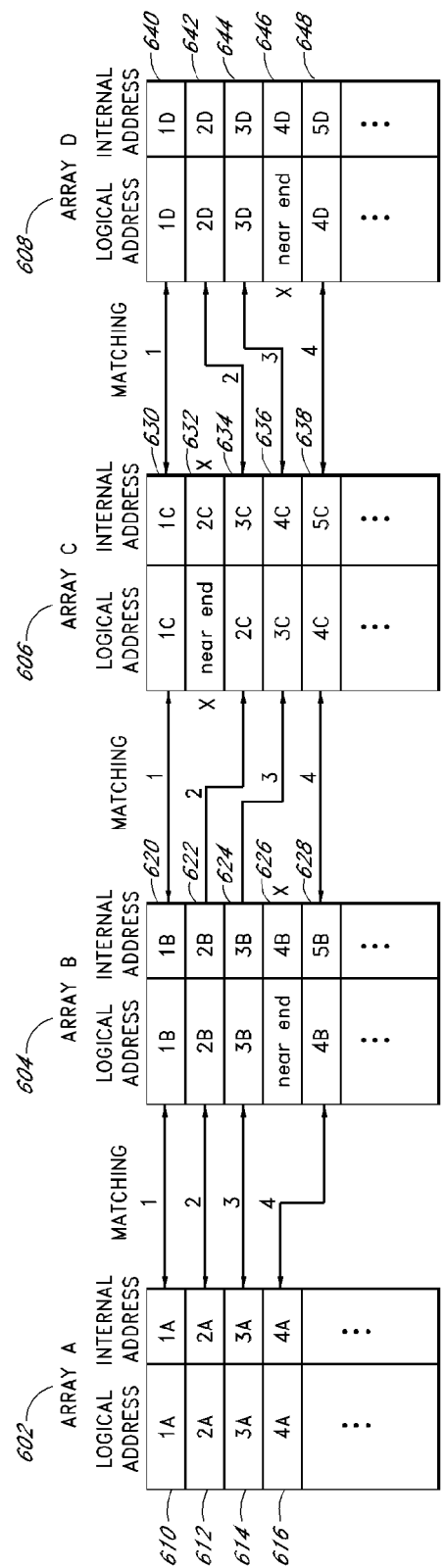
FIG. 6 illustrates an example of collectively mapping blocks for four arrays.

FIG. 5 illustrates an example of collectively mapping blocks for two arrays. The principles and advantages of the collective mapping can be applied to a very wide range of numbers of arrays. For example, FIG. 6 illustrates an example of collectively mapping blocks for four arrays. The status of a block as good or bad can be determined during manufacture or later in the field. A wide variety of techniques can be used to determine whether a block is good or bad. An applicable technique will be readily determined by one of ordinary skill in the art. Moreover, it may be desirable to mark a block as bad even if it is good if, for example, the applicable memory cells are within one more error of not being correctable by error correction codes (ECC), or the applicable memory cells are near wear out limits, etc.

Desirably, the good blocks of the arrays are logically addressed together so that an accessing electronic processing unit, such as a controller, processor, CPU, or other device, can read data rapidly in parallel from the arrays without having to make address jumps or having to read data from arrays separately. In one embodiment, the good blocks are logically rearranged to form consecutively addressable good blocks of memory. In one embodiment, the mapping is performed such that the good blocks are mapped to relatively low addresses, and the bad blocks or unused spare blocks, if any, are mapped to relatively high addresses. The mapping for the unused blocks (bad block or spare blocks) is not critical. Examples will be described below in connection with FIGS. 12A and 12B. In one example, row decoders for a memory device are not shared among the arrays. This permits independent row addressing of blocks of memory from the arrays. Such programming of a row decoder or an address translator to skip over bad blocks in an array and retain a contiguous mapping of good blocks can be readily accommodated at production test. In addition, the repair of blocks that fail in the field can also be accommodated. For example, a bank of fuses can be used to store a repair solution. Fuses can be programmed to identify a logical address range corresponding to an original block that has gone bad. When the logical address range is encountered, a good block (previously redundant) is substituted for the bad block. The fuses can be Flash-based fuses, which permit the reprogramming of repair solutions for field-based repairs.

With reference to FIG. 5, the blocks of array A 502 and array B 504 are collectively associated. Array A 502 and array B 504 can be on the same chip or on different chips. The blocks of array A 502 and array B 504 have logical addresses 506, 508 and have internal addresses 510, 512. The logical addresses 506, 508 are used by devices that access the memory, such as controllers, processors, CPUs, and the like. The internal addresses 510, 512 relate to the original physical addresses within the arrays.

For the purposes of discussion, FIG. 5 will generally be described using the internal addresses 510, 512 as the references for the blocks. In the example, for array A 502, blocks with internal addresses 1A 514, 2A 516, 3A 518, 4A 520, 5A 522, 6A 524, 7A 526, and 8A 528 are shown. Blocks 1A 514, 2A 516, 3A 518, 4A 520, 5A 522, 7A 526, and 8A 528 are good, and block 6A 524 is bad. For array B 504, blocks with internal addresses 1B 530, 2B 532, 3B 534, 4B 536, 5B 538, 6B 540, 7B 542, and 8B 544 are shown. Blocks 1B 530, 2B 532, 4B 536, 5B 538, 7B 542, and 8B 544 are good, and blocks 3B 534 and 6B 540 are bad.

Block 1A 514 is paired with block 1B 530, and both are mapped at the starting logical address for the blocks, which is typically 0 for the first page of the block. Block 2A 516 is paired with block 2B 532, and both are mapped at the next block address, i.e., the second logical block address for the first page. This is typically a fixed offset from 0 and typically varies depending on the number of pages for a block.

Block 3B 534, which is bad, is not intentionally paired and is mapped to an unused address, such as to an address near the end of the range of addresses for the array. In one embodiment, the mapping process remaps the bad blocks starting with the last available block addresses first (highest addresses) and progressively maps bad blocks to lower addresses as the bad blocks are encountered. This permits the good blocks to be mapped in a first contiguous address space at the beginning (starting block address) for the blocks of the array, and the bad blocks to be mapped in a second contiguous address space at the end of the address range. The mapping of the good blocks to a relatively large contiguous address space provides a relatively large usable memory area for the user. However, other techniques for separating the logical addresses for the good blocks from the bad blocks will be readily determined by one of ordinary skill in the art.

Block 3A 518 is paired with block 4B 536, and both are mapped to the third logical block address. With remapping and the use of separate row decoders for each array, block 3A 518 and block 4B 536 can both be mapped to the same logical address 508 and accessed at the same time even though internally within the arrays 502, 504, the blocks 518, 536 are at disparate internal addresses as determined by row count within the arrays 502, 504. Block 4A 520 is paired with block 5B 538, and is mapped to the fourth logical block address. Block 5A 522 is paired with block 7B 542, and mapped to the fifth logical block address. Block 6A 524 is bad, not paired, and is mapped towards the end of the addresses for the array A 502. Block 6B 540 is bad, not paired, and is mapped towards the end of the addresses for the array B 504. Block 7A 526 is paired with block 8B 544 and is mapped to the sixth logical block address.

With the mapping described above, each pair of good blocks has a matching logical address 506, 508 and blocks from both arrays 502, 504 are available to be accessed at the same time for rapid access to data by, for example, data writes to or reads of consecutive addresses. In one embodiment, the pages of data from array A 502 are interleaved with pages of data from array B 504 to permit the controller to "ping-pong" back and forth between the arrays 502, 504 when writing or reading pages of data.

FIG. 6 illustrates an example of collectively mapping blocks for four arrays 602, 604, 606, 608. The collective mapping for the first four good blocks for each array 602, 604, 606, 608 is shown. It will be understood that arrays typically have many blocks, e.g., thousands. For clarity, the blocks will be referenced in the following discussion via their internal addresses (e.g., physical row address), which are mapped to logical addresses, which are used by hosts, such as controllers, processors, and the like. Even when matched blocks are at disparate physical addresses (disparate by rows), the matched blocks can be written to or read from at the same time without separate writes or reads, which improves memory performance.

The illustrated portion of array A 602 has four blocks 1A 610, 2A 612, 3A 614, 4A 616, all of which are good. Array B 604 has good blocks 1B 620, 2B 622, 3B 624 and 5B 628. Block 4B 626 is not good. Array C 606 has good blocks 1C 630, 3C 634, 4C 636, and 5C 638. Block 2C 632 is not good. Array D has good blocks 1D 640, 2D 642, 3D 644, and 5D 648. Block 4D 646 is not good.

In the illustrated example, the blocks are matched as follows. Block 1A 610, block 1B 620, block 1C 630, and block 1D 640 are matched. Block 2A 612, block 2B 622, block 3C 634 and block 2D 642 are matched. Block 3A 614, block 3B 624, block 4C 636, and block 3D 644 are matched. Block 4A 616, block 5B 628, block 5C 638, and block 5D 648 are matched.

Block 4B 626, block 2C 632, and block 4D 646 are bad blocks and are mapped to an address space outside of the contiguous address spaces used for the good blocks. For example, the bad blocks can be mapped to the end of the address space.

The matching or "pairing" of the blocks described above preserves the continuity of addresses for accessing memory, which permits reading blocks of memory quickly by alternating among the arrays and/or permits reading data from arrays in parallel. However, the blocks do not have to be mapped in sequential internal address order in order to retain the benefit of consecutive logical addresses. In one embodiment, the data is addressed sequentially as seen by a controller, processor, or CPU, but the actual ordering of the physical blocks within a memory chip can vary and will typically be transparent to the controller or processor. In one embodiment, the mapping is implemented using fuses, such as Flash fuses, to store mapping data. The mapping can be initially determined during production test and updated in the field. In one embodiment, the fuses lie outside of a row decoder, but impact the decoding solution. For example, the fuses can be part of an address translator circuit, can be part of an override circuit that overrides normal row decoding, or the like. In another embodiment, the fuses provide programmability of a row decoder itself.

Figure 7:
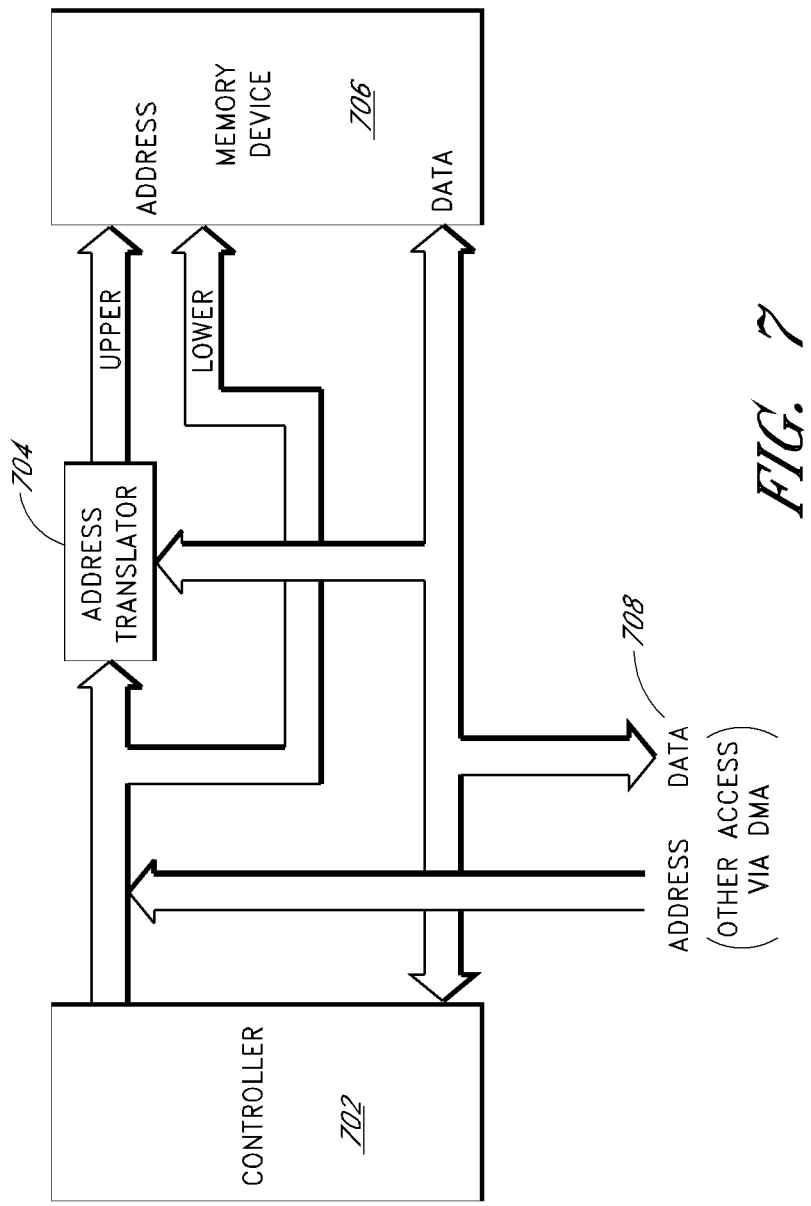
FIG. 7 illustrates an example of a controller, an address translator, and a memory device.

FIG. 7 illustrates an example of a controller 702, an address translator 704, and a memory device(s) 706. The controller 702 represents a controller or other processor that uses the memory device 706. Other controllers or processors can also use the memory device 706 via, for example, direct memory access (DMA) 708. The address translator 704 provides mapping and/or remapping as applicable of the addresses for the blocks of the memory device 706.

In one embodiment, the address translator 704 is outside the memory device 706 as shown in FIG. 7. This permits off-the-shelf memory device(s) 706 to be used, and permits relatively many memory devices 706 to be used per address translator 704.

In another embodiment, the address translator 704 is part of the memory device 706. It should be noted that a single memory device 706 can store multiple memory arrays. The address translator 704 can alternatively be integrated with the controller 702, be integrated with a DMA controller, or be a separate chip. In one embodiment, the address translator translates or maps logical addresses as seen by devices using the memory device 706, such as the controller 702, into the addresses used to retrieve data from the memory device 706. The mapping information can be stored in a lookup table (LUT). In the illustrated embodiment, the blocks of a memory are addressed (block portion of addresses) towards the most significant bit (msb) portions addresses, while pages (if present) and bytes are addressed toward the least significant bit (lsb) portions of the addresses. Where pages of arrays are intended to be read in a "ping-pong" manner, then their address translation can be varied accordingly.

Figure 8:
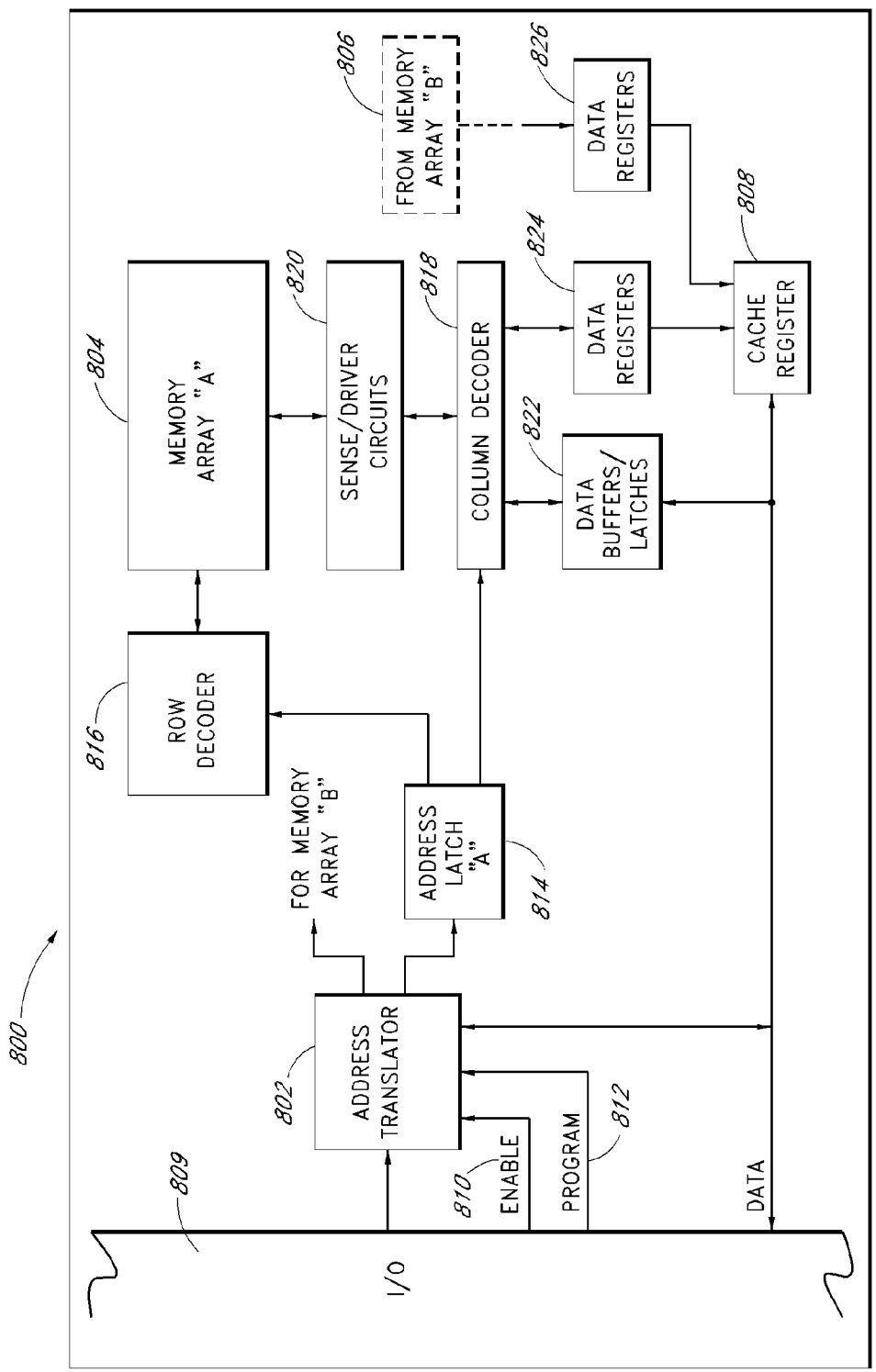
FIG. 8 is a schematic of a memory chip with address translators.

FIG. 8 is a schematic of a memory chip 800 with an address translator 802. In the illustrated example, the memory chip 800 has memory array A 804 and memory array B 806. For clarity, miscellaneous supporting circuits for memory array B 806 are not shown, and in one embodiment are the same as that described for memory array A 804. When implemented on the same chip, the two arrays 804, 806 can share a cache register 808.

The address translator 802 receives logical addresses as an input and provides translated addresses as an output. The logical addresses can originate from, for example, a controller, processor, CPU, or the like, coupled to an input/output circuit 809. In one embodiment, the translation function of the address translator can be selectively enabled or disabled via an enable signal 810. The address translator 802 can also have a mode for programming and a mode for normal usage, which can be selected with a program signal 812. For example, the address translator 802 can be programmed during production test to map good blocks to a contiguous address space.

Outputs of the address translator 802 are provided to an address latch 814 for array A 804 and to another address latch (not shown) for array B 806. The mapping between array A 804 and array B 806 can be different, so the addresses that are latched can also be different. It should be noted that the address translator 802 typically does not have to translate every bit of an address bus, but should at least translate the address bits used for selecting blocks.

An output of the address latch A 814 is provided as an input to a row decoder 816. In one embodiment, the row decoder 816 for memory array A 804 is independent from the row decoder for memory array B 806. This permits disparate physical pages of data (different by physical row address) from memory array A 804 and memory array B 806 to be accessed at the same time with a common logical address. In one embodiment, the row decoder 816 can also be mapped to correct for bad memory locations in rows and/or columns. For example, if a block goes bad in the field, a bank of fuses can be programmed to detect the address range for the bad block and substitute an otherwise redundant block to repair the array. The row decoder 816 selects appropriate rows for reading of data. For example, in the context of NAND Flash, the row decoder 816 can activate a particular row (also known as wordline), and other related rows can be turned "on" such that the particular cells of the selected row can be written or read.

An output of the address latch 814 is also provided as an input to a column decoder 818. In one embodiment, the addresses for the row decoder 816 are translated by the address translator 802, but the addresses for the column decoder 818 are not translated. Sense/driver circuits 820 communicate with the column decoder 818 and array A 804 to write data to or read data from array A 804. Data buffers/latches 822 store data from the input/output circuit 809 for storage in memory array A 804, and data registers 824, 826 store data retrieved from memory array A 804, memory array B 806, respectively. The cache register 808 provides data from the data registers 824, 826 for fast access to the data. If memory array A 804 and memory array B 806 are not on the same chip, then the cache register 808 will typically not be shared.

Figure 9:
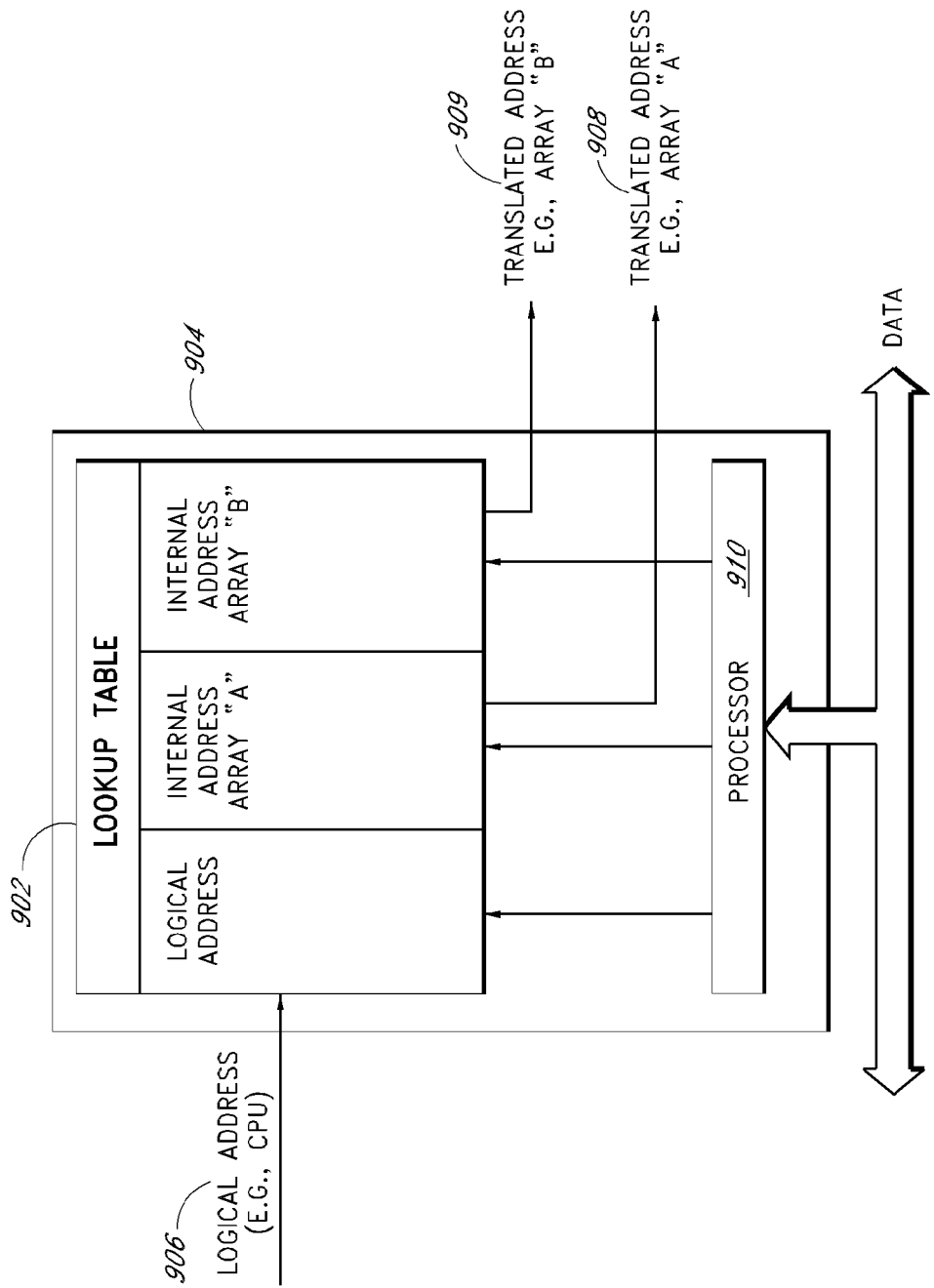
FIG. 9 illustrates an example of a lookup table (LUT) for implementation of address translation.

FIG. 9 illustrates an example of a lookup table (LUT) 902 for an implementation of address translation. In one embodiment, the lookup table 902 is implemented as a programmable non-volatile memory, such as EEPROM or Flash memory (NOR or NAND). In one embodiment, an address translator 904 is implemented by programming the lookup table 902 during production test, and using the programmed lookup table during operation. In one embodiment, the lookup table 902 is also reprogrammable in the field such as via firmware or state machine control. The lookup table 902 can alternatively be implemented by a volatile memory device, such as static RAM, that is loaded with the appropriate data before use, which can provide faster speed during use.

In the illustrated embodiment, the address translator 904 receives a logical address 906 as an input, and provides two or more addresses 908, 909 as outputs. The logical address 906 does not need to be the full address, e.g., can be the portion of the addresses for addressing blocks. One address 908 can be for addressing data of one array, and another address 909 can be for addressing data of the other array of the pair. In the illustrated embodiment, addresses for both arrays are translated for efficient access of data for the CPU. For example, a CPU can read data faster if the data is available at contiguous addresses.

However, the addresses for an array can remain untranslated, and the addresses for the good blocks of the other arrays translated to match with the untranslated addresses of the untranslated array. For example, during the programming process, the address translator 904 can be configured to pass through the logical address 906 to one or more translated addresses 908, 909 without modification. The translated addresses 908, 909 can be different from each other so that data from blocks of disparate addresses can be efficiently retrieved. When the address translator 904 is enabled for translation operations, a logical address 906 can be applied to the lookup table 902 as an address to a memory location, and the translated address 908 can be retrieved from the stored data of the lookup table 902.

In the illustrated embodiment, the lookup table 902 has maps for two arrays. In another embodiment, the lookup table 902 can store maps for more than two arrays. In addition, the lookup table 902 can be alternatively be configured to store each map for each array in separate tables. In one embodiment, a processor 910, such as a microprocessor, microcontroller, licensable core, state machine, or the like, is configured to generate the map stored in the lookup table 902. The processor 910 can be part of the memory device, can be a separate chip in a system, can be the processor of a device using the memory, or the like. In one embodiment, the processor 910 is implemented by test equipment. The lookup table 902 can be implemented in a variety of ways. For example, in one embodiment, only the block address portions (such as a bit range within the address) for address data at the memory block level is stored in the lookup table 902, and the rest of the address from the CPU is combined to form the complete address for the memory array. Thus, the portion of the block address that is remapped can be remapped using a parameter, such as replacement data for that portion of the address. For example, in another embodiment, the lookup table 902 stores offsets for generating the new addresses, rather than the address itself, and the parameter used for remapping can be the offset.

Figure 10:
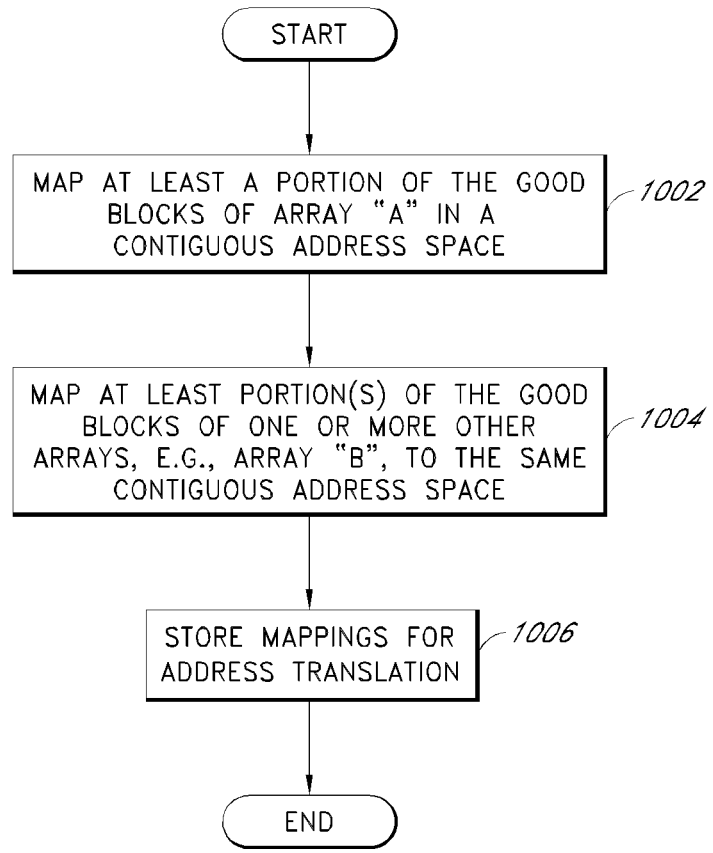
FIG. 10 is a flowchart generally illustrating collective block mapping.

FIG. 10 is a flowchart generally illustrating collective block mapping. It will be appreciated by the skilled practitioner that the illustrated process can be modified in a variety of ways. For example, in another embodiment, various portions of the illustrated process can be combined, can be rearranged in an alternate sequence, can be removed, and the like. The illustrated process can be used to match blocks for two or more memory arrays.

The process begins by mapping 1002 at least a portion of the good blocks of an array, e.g., array "A," in a contiguous address space (logical addresses). In one embodiment, the contiguous portion includes at least enough good blocks to provide enough memory space to meet the specified memory capacity for the array. Accordingly, the at least enough good blocks can comprise fewer than all of the good blocks. In one embodiment, the portion of contiguous blocks includes all of the good blocks as shown in FIG. 12A. In another embodiment, the portion of contiguous blocks includes only a portion of the good blocks sufficient to provide enough memory space to meet the specified memory capacity for the array as shown in FIG. 12B. One embodiment of a process for performing the mapping 1002 will be described in greater detail later in connection with FIG. 11.

Referring again to FIG. 10, the process advances to map 1004 at least portions of the good blocks of one or more other arrays, e.g., array "B," to the same contiguous address space. The mapping of the good blocks to the same contiguous address space ensures that the blocks of the arrays thusly mapped share the same logical addresses for efficient access. For example, the different arrays can use independent row decoders to permit access to blocks at disparate physical addresses at the same time.

The process advances to store 1006 mappings for address translation to particular blocks of the various memory arrays. In one embodiment the mappings are stored in a lookup table as described earlier in connection with FIG. 9. In another embodiment, the particular mappings for an array are stored by programming a row decoder for the array.

Figure 11:
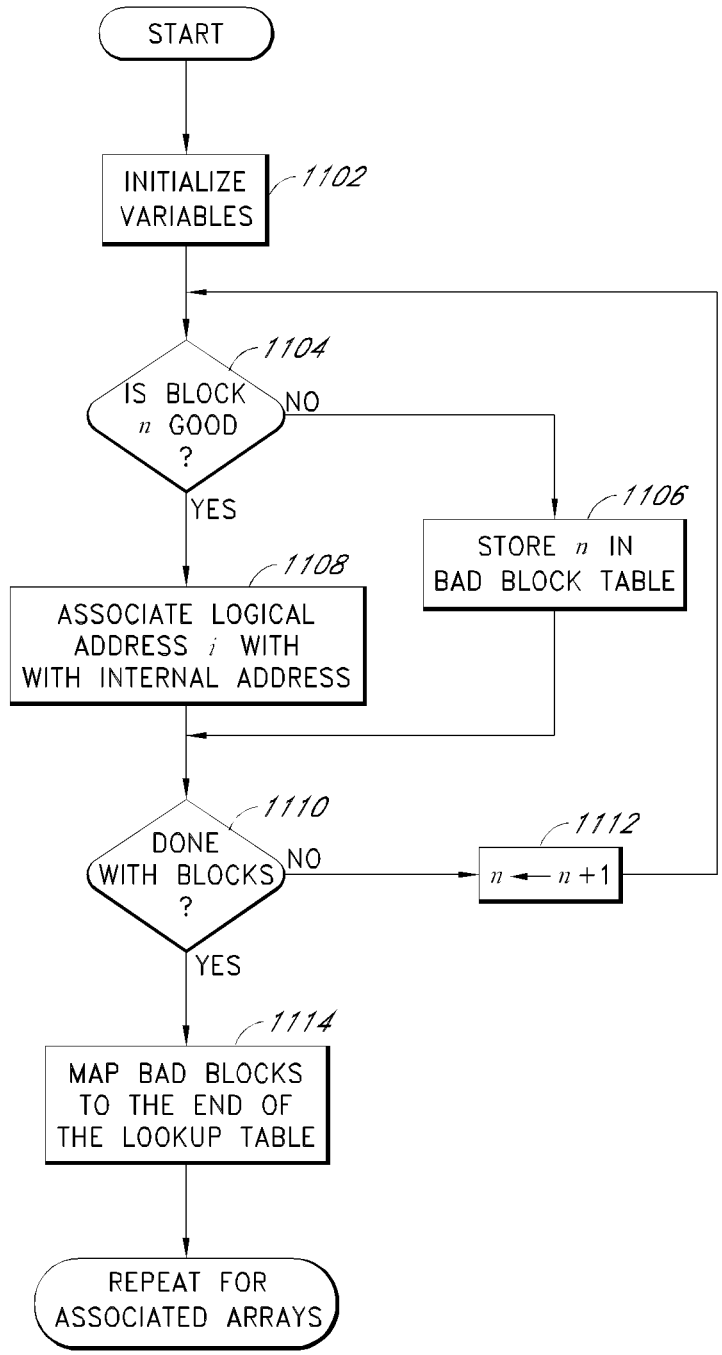
FIG. 11 is a flowchart generally illustrating block mapping within an array.
Figures 12A, 12B:
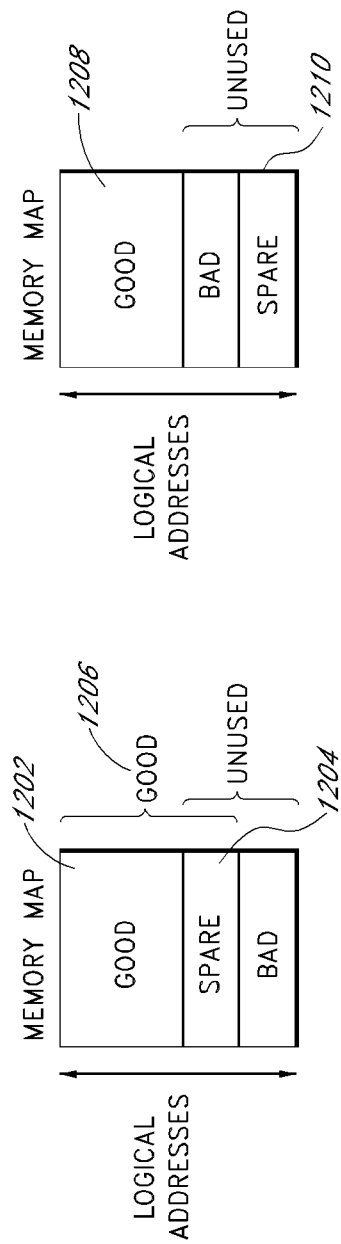
FIGS. 12A and 12B illustrate examples of memory maps.

FIG. 11 is a flowchart generally illustrating block mapping within an array. The illustrated process maps the good blocks of an array into a contiguous address space. The process can be repeated as necessary for other arrays. It will be appreciated by the skilled practitioner that the illustrated process can be modified in a variety of ways. For example, in another embodiment, various portions of the illustrated process can be combined, can be rearranged in an alternate sequence, can be removed, and the like.

The process begins by initializing 1102 variables. In the flowchart, n indicates the physical or internal block number (address) and, for example, can be initialized to 0. Variable i indicates the logical address and should be initialized to the starting logical address for the first block of array A. For the purposes of discussion, variable i can begin at 0.

The process advances to determine 1104 whether block n (address n) is good. For example, memory devices typically have a reference table populated during production test (and updateable by, for example, a controller during use) in a known good memory space that indicates which memory blocks are good and which are bad. If the block is bad, the process stores 1106 the block number n in a bad block table. The process advances from the state 1106 to a decision block 1110.

If the block is good, the process associates 1108 logical address i with block number n. The process advances from the state 1108 to the decision block 1110.

The process determines 1110 whether it is done with the blocks of the array being processed. If it is not yet done, the process proceeds to a state 1112, where the process increments the block number n to prepare for processing the next block. The process then returns from the state 1112 back to the decision block 1104.

If the process is complete, the process proceeds from the decision block 1110 to a state 1114, in which the process associates or maps the bad blocks collected in the state 1106 with addresses at the end of the lookup table or to the end of an address range for a row decoder. The bad blocks can alternatively be mapped to the end of the lookup table at a different point in the process, such as in the state 1106. The process can be repeated for the other associated arrays. One advantage of the process described in connection with FIG. 11 is that the blocks of the individual arrays can be processed to be addressable in contiguous blocks, such that knowledge of the locations of the good blocks of other arrays is not required.

FIG. 12A illustrates an example of a memory map for a memory array, wherein all of the good blocks whether used 1202 or spare 1204 are mapped to a contiguous space 1206 of logical memory addresses. FIG. 12B illustrates another example of a memory map for a memory array, wherein the good blocks 1208 that are to be used are mapped to a contiguous space of logical addresses, and good blocks that are spare blocks 1210 are mapped to an address space that is not contiguous with the address space for the good blocks that are used.

Embodiments of the invention advantageously permit a controller or the like to address data from matched blocks of disparate arrays using the same logical address. For example, the addresses of one or more good blocks of the memory arrays are mapped such that the controller does not need to switch back and forth among two or more different logical addresses when accessing data from matched blocks of disparate arrays having different physical addresses. Independent row decoders permit pages of data of matched blocks having disparate physical addresses to be stored to or retrieved from multiple arrays at the same time. This can permit data to be accessed relatively efficiently in, for example, multi-channel data busses, ping-ponged arrays, and the like.

One embodiment is an apparatus for organizing access for matched blocks of data spread among two or more disparate memory arrays, wherein the apparatus includes: an address translator configured to receive at least a block portion of logical addresses originating from a processor, wherein the block portion corresponds to an address range for selecting blocks of memory, wherein the address translator is configured to modify at least the received block portion of the received logical addresses to generate at least one of first modified addresses or second modified addresses, wherein the first modified addresses are for selection of memory blocks for a first memory array of the two or more memory arrays, wherein the second modified addresses are for selection of memory blocks for a second memory array of the two or more memory arrays, wherein the first modified addresses and the second modified addresses are configured to select matched blocks of the first memory array and the second memory array, respectively, using a same logical address for a block portion of the logical address; a first row decoder in communication with the address translator to receive the first modified addresses, the first row decoder coupled to the first memory array; and a second row decoder in communication with the address translator to receive the second modified address, the second row coupled to the second memory array, the second row decoder independent of the first row decoder.

One embodiment is a method of matching blocks of memory space for two or more memory arrays for access of data associated with the matching blocks using a same logical address, wherein the method includes: associating usable good blocks of a first array of the two or more memory arrays with usable good blocks of a second array of the two or more memory arrays in a contiguous logical address space such that matching good blocks of memory for the two or more memory arrays are logically addressable with a same logical address for a block portion of the logical address, wherein at least a portion of the usable good blocks of the first array associated with the good blocks of the second array have different physical addresses, and wherein the associated good blocks of the first array and the second array are accessible at the same time even with disparate physical addresses; and storing the associations for logical address translation.

One embodiment is a method of modifying addresses for access to two or more disparate memory arrays, wherein the method includes: receiving logical addresses from a processor for access to memory locations of two or more disparate memory arrays, wherein block portions of the logical addresses relate to addressing of particular blocks within memory arrays; generating first modified addresses for a first memory array from the logical addresses and stored parameters corresponding to selected memory blocks of the first memory array to rearrange access to the selected memory blocks such that at least a first group of good memory blocks of at least a minimum number of good memory blocks specified for the first memory array is accessible in a contiguous logical memory address space and such that bad blocks are not addressed within the contiguous logical memory address space; generating second modified addresses for a second memory array from the logical addresses and stored parameters corresponding to selected memory blocks of the second memory array to rearrange access to the selected memory blocks such that at least a second group of good memory blocks of at least a minimum number of good memory blocks specified for the second memory array are accessible in the contiguous logical memory address space and such that bad blocks are not addressed within the contiguous logical memory address space; and using the first modified addresses and the second modified addresses to access matched blocks of the first memory array and the second memory array such that the matched blocks are addressable by the processor using a same block portion for the logical address, and such that the matched blocks are accessible at the same time even when the matched blocks have disparate physical addresses.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

I claim:

1. An apparatus comprising a memory device, the apparatus comprising:
   a plurality of memory arrays including at least a first memory array and a second memory array;
   an address translator configured to receive at least a block portion of logical addresses originating from a processor, wherein the block portion corresponds to an address range for selecting blocks of memory, wherein the address translator is configured to modify the received block portion of the logical addresses to generate first modified addresses for the first memory array and second modified addresses for the second memory array for a contiguous logical addresses space;
   wherein blocks of memory from the first memory array and the second memory array are paired for simultaneous access even when the blocks have disparate physical addresses, wherein pairing blocks from the first memory array and the second memory array is performed by:
      identifying good blocks and bad blocks of the first memory array and good blocks and bad blocks of the second memory array;
      mapping a good block at a starting physical address of the first memory array with a good block at a starting address of the second memory array; and
      consecutively stepping through physical addresses of the first memory array and the second memory array, mapping a next good block of the first memory array with a next good block of the second memory array, skipping only bad blocks of the first memory array and bad blocks of the second memory array, until all good blocks of the first memory array or the second memory array are paired;
   wherein accesses to pages from paired blocks are interleaved; and
   a plurality of cache registers including at least a first cache register and a second cache register, wherein the first cache register is disposed in a first signal path between a bus and the first memory array, wherein the second cache register is disposed in a second signal path between the bus and the second memory array, wherein the first cache register is configured to provide first data originally retrieved from the first memory array to a data bus while the second cache register is retrieving second data from the second memory array.

2. The apparatus of claim 1, wherein the first and second cache registers are configured to alternatingly load data and provide data from the first cache register and the second cache register.

3. The apparatus of claim 1, wherein the first and second cache registers are configured to hold data for programming to the first and second memory arrays, respectively, wherein one of the first or the second cache registers is configured to provide data to the first or the second memory array while the other of the first or the second cache registers receives new data from the bus.

4. The apparatus of claim 1, wherein the plurality of memory arrays comprise NAND flash memory arrays.

5. The apparatus of claim 1, wherein the address translator is programmable.

6. The apparatus of claim 1, wherein at least a portion of the address translator is embodied as a programmable row decoder for the first memory array or the second memory array.

7. The apparatus of claim 1, wherein the apparatus is embodied in a controller outside of a memory device.

8. The apparatus of claim 1, wherein the apparatus is embodied within a memory device.

9. A method of accessing data from a memory device, the method comprising:
retrieving first data from a first memory array of the memory device and loading the first data to a first cache register of the memory device;
receiving at least a block portion of logical addresses originating from a processor, wherein the block portion corresponds to an address range for selecting blocks of memory;
modifying the received block portion of the logical addresses to generate first modified addresses for the first memory array and second modified addresses for a second memory array for a contiguous logical addresses space;
pairing blocks of memory from the first memory array and the second memory array for simultaneous access even when the blocks have disparate physical addresses, wherein pairing blocks of the first memory array and the second memory array comprises:
identifying good blocks and bad blocks of the first memory array and good blocks and bad blocks of the second memory array;
mapping a good block at a starting physical address of the first memory array with a good block at a starting address of the second memory array; and
consecutively stepping through physical addresses of the first memory array and the second memory array, mapping a next good block of the first memory array with a next good block of the second memory array, skipping only bad blocks of the first memory array and bad blocks of the second memory array, until all good blocks of the first memory array or the second memory array are paired;
wherein accesses to pages from paired blocks are interleaved; and
providing the first data from the first cache register to a data bus while retrieving second data from the second memory array of the memory device and loading the second data to a second cache register of the memory device.

10. The method of claim 9, further comprising alternatingly loading data and providing data from the first cache register and the second cache register.

11. The method of claim 9, further comprising:
holding data for programming to the first and second memory arrays, respectively; and
providing data to the first or the second memory array from one of the first or the second cache registers while receiving new data from the bus to the other of the first or the second cache registers.

12. The method of claim 9, wherein the first memory array and the second memory array each comprise NAND flash memory arrays.

13. The method of claim 9, wherein the modifying the received block portion of the logical addresses is performed by an address translator, and wherein the address translator is programmable.

14. The method of claim 9, wherein at least a portion of the address translator is embodied as a programmable row decoder for the first memory array or the second memory array.

15. The method of claim 9, wherein the method is embodied in a controller outside of a memory device.

16. The method of claim 9, wherein the method is embodied within a memory device.

17. An apparatus comprising:
a host processor; and
a memory device comprising:
a plurality of memory arrays including at least a first memory array and a second memory array;
an address translator configured to receive at least a block portion of logical addresses originating from a processor, wherein the block portion corresponds to an address range for selecting blocks of memory, wherein the address translator is configured to modify the received block portion of the logical addresses to generate first modified addresses for the first memory array and second modified addresses for the second memory array for a contiguous logical addresses space;
wherein blocks of memory from the first memory array and the second memory array are paired for simultaneous access even when the blocks have disparate physical addresses, wherein pairing blocks from the first memory array and the second memory array is performed by:
identifying good blocks and bad blocks of the first memory array and good blocks and bad blocks of the second memory array;
mapping a good block at a starting physical address of the first memory array with a good block at a starting address of the second memory array; and
consecutively stepping through physical addresses of the first memory array and the second memory array, mapping a next good block of the first memory array with a next good block of the second memory array, skipping only bad blocks of the first memory array and bad blocks of the second memory array, until all good blocks of the first memory array or the second memory array are paired;
wherein accesses to pages from paired blocks are interleaved; and
a plurality of cache registers including at least a first cache register and a second cache register, wherein the first cache register is disposed in a first signal path between a bus and the first memory array, wherein the second cache register is disposed in a second signal path between the bus and the second memory array, wherein the first cache register is configured to be able to provide first data originally retrieved from the first memory array to a data bus while the second cache register is retrieving second data from the second memory array.

18. The apparatus of claim 17, wherein the first and second cache registers are configured to alternatingly load data and provide data from the first cache register and the second cache register.

19. The apparatus of claim 17, wherein the first and second cache registers are configured to hold data for programming to the first and second memory arrays, respectively, wherein one of the first or the second cache registers is configured to provide data to the first or the second memory array while the other of the first or the second cache registers receives new data from the bus.

20. The apparatus of claim 17, wherein the plurality of memory arrays comprise NAND flash memory arrays.

* * * * *